United States Patent
Riley (10) Patent No.: US 7,324,030 B2
(45) Date of Patent: Jan. 29, 2008

(54) MULTIPLE STAGE DELTA SIGMA MODULATORS

(75) Inventor: Tom Riley, Osgoode (CA)

(73) Assignee: Kaben Wireless Silicon Inc., Ottawa, Ontario (CA)

( * ) Notice: Subject to any disclaimer, the term of this patent is extended or adjusted under 35 U.S.C. 154(b) by 0 days.

(21) Appl. No.: 11/529,248

(22) Filed: Sep. 29, 2006

(65) Prior Publication Data

US 2007/0018871 A1    Jan. 25, 2007

Related U.S. Application Data

(63) Continuation-in-part of application No. PCT/CA2004/000512, filed on Apr. 2, 2004.

(51) Int. Cl.
*H03M 3/00* (2006.01)

(52) U.S. Cl. ...................... 341/143; 341/155

(58) Field of Classification Search ............... 341/143, 341/155; 375/376, 244
See application file for complete search history.

(56) References Cited

U.S. PATENT DOCUMENTS

| | | | | |
|---|---|---|---|---|
| 4,393,742 A | * | 7/1983 | Wachi | 84/624 |
| 4,393,743 A | * | 7/1983 | Wachi | 84/624 |
| 4,965,531 A | * | 10/1990 | Riley | 331/1 A |
| 5,027,306 A | * | 6/1991 | Dattorro et al. | 708/313 |
| 5,724,037 A | * | 3/1998 | Lee | 341/143 |
| 6,028,544 A | * | 2/2000 | Zarubinsky et al. | 341/143 |
| 6,150,969 A | * | 11/2000 | Melanson | 341/143 |
| 6,433,643 B1 | * | 8/2002 | Opsahl et al. | 331/1 A |
| 6,570,518 B2 | | 5/2003 | Riley et al. | |
| 6,646,581 B1 | * | 11/2003 | Huang | 341/143 |
| 6,693,468 B2 | * | 2/2004 | Humphreys et al. | 327/105 |
| 6,707,855 B2 | * | 3/2004 | Patana | 375/244 |
| 2002/0145472 A1 | | 10/2002 | Oh | |
| 2002/0186055 A1 | | 12/2002 | Hietala et al. | |
| 2003/0235261 A1 | * | 12/2003 | Patana | 375/376 |
| 2004/0189499 A1 | * | 9/2004 | Han et al. | 341/143 |

FOREIGN PATENT DOCUMENTS

| | | |
|---|---|---|
| FR | 2818833 | 6/2002 |
| WO | WO 00/62428 | 10/2000 |

* cited by examiner

*Primary Examiner*—Jean Bruner Jeanglaude
(74) *Attorney, Agent, or Firm*—Shapiro Cohen (57) ABSTRACT

A delta sigma modulator which employs a plurality of accumulators with non-power-of-2 modulus. The accumulators may consist of a primary non-power-of-2 modulus accumulator and a secondary non-power-of-2 modulus accumulator. The number of bits in the primary accumulators affects the frequency resolution of the resultant delta sigma fractional N frequency synthesizer and can be the minimum number of bits required by the resolution specification. The secondary accumulator integrates the carry outputs of its corresponding primary accumulators. This integration results in attenuating the dc content of the modulator output by a factor equal to the modulus of the secondary accumulators and may require compensation in the recombination block.

17 Claims, 5 Drawing Sheets

MULTIPLE STAGE DELTA SIGMA MODULATORS

CROSS REFERENCE TO RELATED APPLICATIONS

This application is a continuation-in-part of international application Number PCT/CA2004/000512 filed 2 Apr. 2004.

FIELD OF THE INVENTION

The present invention relates to multiple stage delta sigma modulators. More specifically, the present invention relates to but is not limited to delta sigma modulators which utilize cascaded accumulators having a modulus other then $2^n$ where n is a natural number.

BACKGROUND TO THE INVENTION

Delta-Sigma fractional N frequency synthesizers provide low phase noise, fast channel switching speed and fine frequency resolution simultaneously. The Delta-Sigma Modulator (DSM) is a key component which is used to control a programmable divider in a phase locked loop (PLL) to achieve fractional division. The input to the DSM is a digital word representing the fractional portion of the desired division ration. The output is a single-bit or multi-bit stream with an average equal to the fractional value of the input to the DSM and high-pass filtered quantization noise. The high frequency quantization error in the bit stream is converted to high frequency phase error in the PLL. In a well designed loop this high frequency noise is filtered out by the low-pass filtering function of the closed loop.

Compared with integer N frequency synthesizers, delta sigma fractional N synthesizers, however, have two drawbacks: additional silicon area and current consumption due to the presence of a delta sigma modulator and quantization noise injected into the PLL collectively by the divider and the delta sigma modulator. The quantization noise may consist of only discrete tones with large amplitude. In the time-domain, the same problem manifests itself as short sequence length. This originates from the fact that a DSM with a dc input is a digital state machine with a finite number of possible states. Such a problem is especially the case when the number of bits in the accumulators forming the DSM is small. The minimum bit number is determined by the synthesizer frequency resolution specification. For GSM, where the reference frequency is 13 MHz and the frequency resolution is 200 kHz, the minimum number of bits is 7. A DSM with such a small bit number would usually exhibit high discrete tones in its output spectrum for most inputs. Traditionally, the accumulators in such DSMs have been modulo power-of-2 accumulators since binary arithmetic is simpler to implement in digital logic.

SUMMARY OF THE INVENTION

The present invention reduces the high discrete tone problem by providing a delta sigma modulator which employs a plurality of accumulators with non-power-of-2 modulus. The accumulators may consist of a primary non-power-of-2 modulus accumulator and a secondary non-power-of-2 modulus accumulator. The number of bits in the primary accumulators affects the frequency resolution of the resultant delta sigma fractional N frequency synthesizer and can be the minimum number of bits required by the resolution specification. The secondary accumulator integrates the carry outputs of its corresponding primary accumulators. This integration results in attenuating the dc content of the modulator output by a factor equal to the modulus of the secondary accumulators and may require compensation in the recombination block.

In one embodiment, the present invention provides a delta sigma modulator comprising, a cascade series of non-power-of-2-modulus accumulators for producing carry outputs, and a recombiner coupled to receive the carry outputs to generate the delta sigma modulator output. Each non-power-of-2-modulus accumulator consists of a primary non-power-of-2-modulus accumulator and a secondary non-power-of-2-modulus accumulator. The first primary accumulator of the cascade series is coupled to receive an input and produces a intermediate carry output which is a quantization of the input and a residue output which is a quantization noise signal. Subsequent primary accumulators are coupled to receive the residue output of the preceding stage and produces intermediate carry outputs and residue outputs. The residue output of the last stage is not used. Each of the secondary accumulators is arranged to receive the residue output of the preceding secondary accumulator and the carry output of the corresponding primary accumulator and produces a final carry output. The recombiner is coupled to receive all the final carry outputs and generates the modulator output.

The invention also provides a delta sigma modulator which includes a filtering function in the recombiner to compensate for attenuation on the dc content of the delta sigma modulator. The dc gain of the filtering function is equal to the modulus of the secondary accumulator or is a multiple of it.

In yet another embodiment, the invention provides a delta sigma modulator which includes a dithering bit stream generator which acts as a dithering source to the modulator. The output of the generator is added to the input of one of the primary accumulators other than the one receiving the input. The dithering bit stream can either be pseudo-random or periodic.

In a first aspect the present invention provides a delta sigma modulator for use with a delta sigma frequency synthesizer, the modulator comprising:
a first group of accumulators;
a second group of accumulators;
a recombiner producing an output of said modulator; and
a bit stream generator, wherein
each group of accumulators comprises a plurality of accumulators coupled to one another;
said second group of accumulators receives an input representing a fractional portion of divider division ratio used by said delta sigma frequency synthesizer;
said first group of accumulators receives input from said second group of accumulators;
at least one accumulator in said second group of accumulators receives an input from said bit stream generator;
said recombiner receives input from said first group of accumulators; and
both of said first and second groups of accumulators are synchronously clocked.

In a second aspect the present invention provides a delta sigma modulator for use in a delta sigma frequency synthesizer, the delta sigma modulator comprising:
a first group of cascaded accumulators, said first group of accumulators including at least one accumulator having a modulus selected from a group of values which excludes $2^n$, n being a natural number, at least one of said first group of accumulators receiving an input from another of said first group of accumulators;

a second group of cascaded accumulators, at least one of said second group of accumulators receiving an input from another of said second group of accumulators;

a recombiner producing an output of said modulator; and a bit stream generator, wherein at least one of said first group of accumulators receives an input from one of said second group of accumulators;

each one of said second group of accumulators has a modulus equal to a ratio between a frequency input to said synthesizer and a desired frequency resolution;

each one of said accumulators in said first group produces an output received by said recombiner; and at least one of said accumulators in said second group of accumulators receives an output of said generator.

BRIEF DESCRIPTION OF THE DRAWINGS

A better understanding of the invention will be obtained by considering the detailed description below, with reference to the following drawings in which.

DETAILED DESCRIPTION

Figure 1:
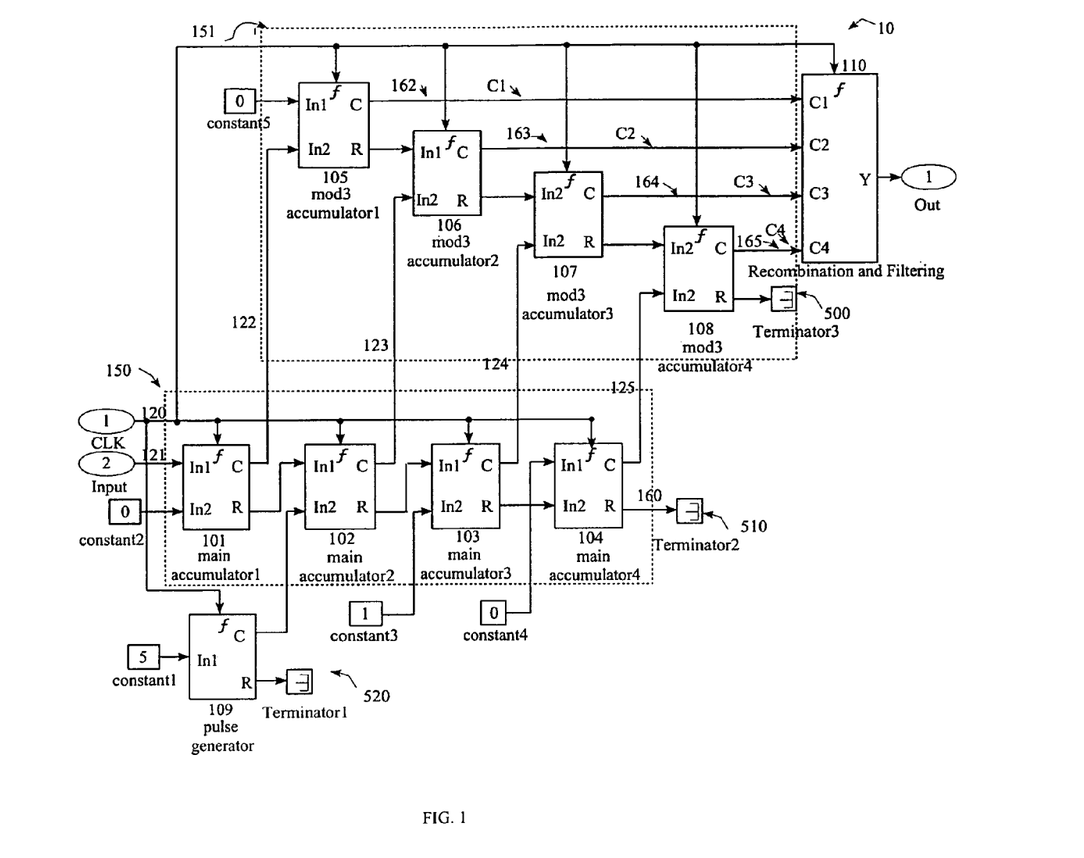
FIG. 1 is a block diagram of the delta sigma modulator according to the invention.

Referring to FIG. 1, a delta sigma modulator 10 has a recombiner 110, a first series 151 and a second series 150 of cascaded accumulators, and a bit-stream generator 109. The second series 150 consists of accumulators 101, 102, 103, and 104 while the first series 151 comprises accumulators 105, 106, 107 and 108. Each accumulator has one clock terminal, two data input terminals, in1 and in2, and two outputs terminals C and R. The C output terminal produces the carry output and the R output terminal produces the residue output. in1 can receive multiple bit inputs while in2 can only receive a single bit number. Accumulators in the same group (e.g. series 151 and series 150 of accumulators) have the same modulus.

For each of the accumulators in the second series 150 of accumulators, the in1 terminal is connected to the R terminal of the preceding accumulator, except the first accumulator whose in1 terminal is connected to the modulator input 121. Modulator input 121 is a value representing the fractional portion of the divider division ratio. The in2 terminal of accumulator 101 must be set to zero. The in2 terminals for accumulators 102, 103 and 104 can either be set to a constant one or zero or fed with a bit stream. As an example, in2 terminal for accumulator 102 is fed from a bit stream generator 109 which acts as dithering source while these for accumulators 103 and 104 are set to one or zero. It should be noted, however, that the output of the dithering source is preferably fed into accumulator 102 to maximize its effect of randomizing the modulator output. The bit stream generator can be implemented as a straightforward accumulator with the carry output being used as the dithering signal. The accumulator used as the bit stream generator 109 may have a bit number (bit width) significantly smaller than that of the primary accumulators 101, 102, 103 and 104 and its input can be set to a constant.

The outputs 122, 123, 124 and 125 of the second series 150 of accumulators are fed into the in2 terminals of the corresponding accumulators in the first series 151. Similar to the second series 150, the in1 terminal of an accumulator in the first series 151 is also fed from the R terminal of the preceding stage, except the first stage where the in1 terminal is constantly set to zero. The outputs 160 and 161 of the two last stage accumulators 104 and 108 are not used. These outputs 160, 161 are sent to terminators 500, 510. The outputs 162, 163, 164 and 165 of the first series 151 are fed to the corresponding input terminals of recombiner 110.

A preferred accumulator for the first series 151 is a modulo-3 accumulator. Such an accumulator generates a carry output when its contents (i.e., the sum of the all the data inputs to the adder forming the accumulator) reach a value of 3. A modulo number different from a power of 2 (a value other than $2^n$ where n is a natural number) helps randomize the final output of the modulator. The dc content of the modulator final output is equal to that of the carry output of accumulator 105. The carry outputs of accumulators 106, 107 and 108 have no dc content. In one embodiment, since accumulator 105 has a modulo of 3, it integrates the carry output of accumulator 101, the average of the output of accumulator 105 is the output of accumulator 101. That is, accumulator 105 attenuates the dc content of the output of accumulator 101 by a factor of 3. Since the dc content of the output of accumulator 101 is equal to the modulator input, it follows that the modulator output would be one third of its decimal input value if the recombiner had no dc gain. As will described shortly, a preferred embodiment of this block includes a filtering function block which has a dc gain of 3. Compensation for the dc content attenuation is unnecessary from the point view of channel programming. However the dc content attenuation will make the channel programming more complicated as the factor of 3 has to be taken into account.

A preferred accumulator used in the second series 150 of cascaded accumulators is one with a modulo equal to the ratio of the available reference frequency over the desired synthesizer frequency resolution. The modulus is chosen so as to produce just enough frequency resolution. For example, the modulo can be 65 for GSM applications as the available reference frequency is 13 MHz while the required channel spacing is 200 kHz. Moduli of greater than 65 would reduce the unwanted discrete tones but is unnecessary for delta sigma modulators that fall within the scope of the present invention.

Figure 2:
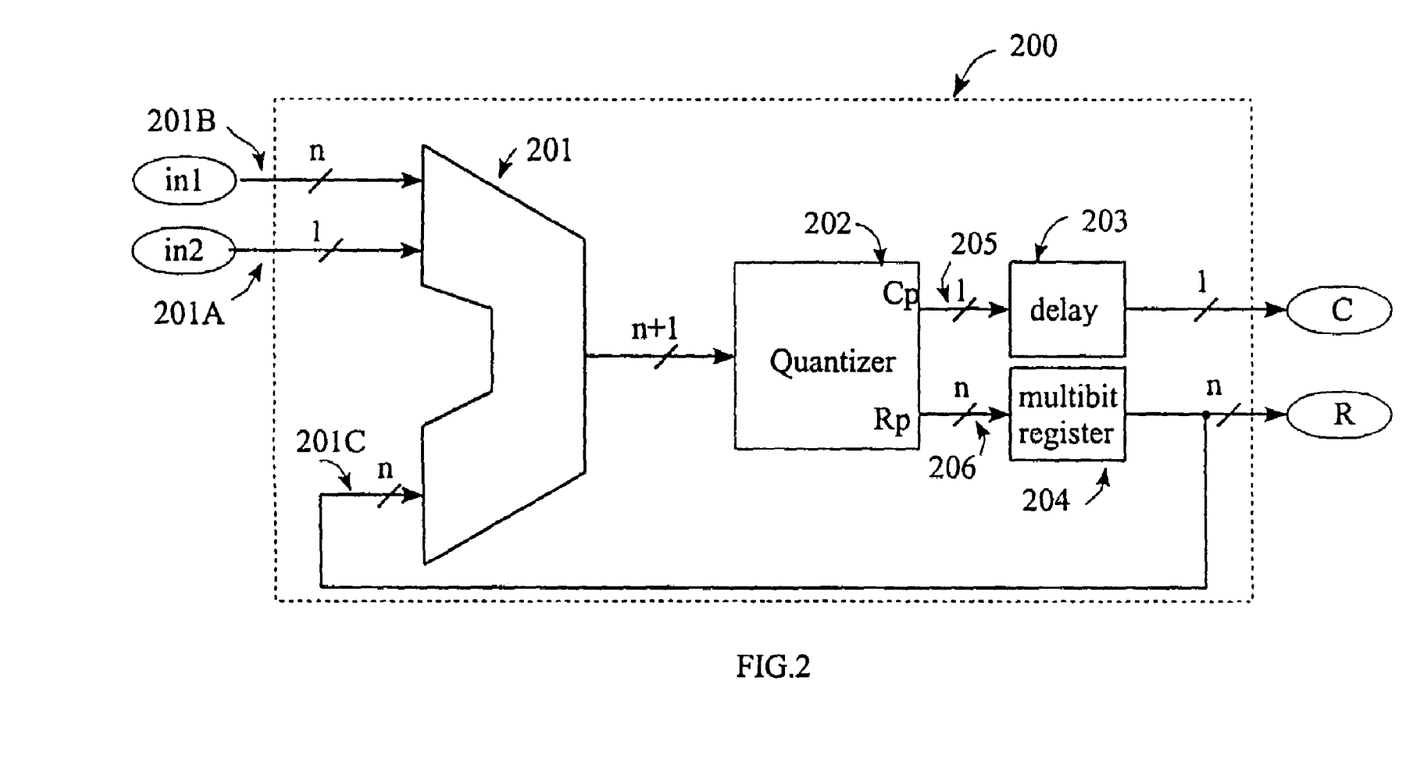
FIG. 2 is a block diagram of an accumulator suitable for use in the modulator of FIG. 1.

FIG. 2 illustrates a block diagram of an accumulator 200 which may be used in FIG. 1. Accumulator 200 comprises an adder 201, a quantizer 202, a single-bit delay 203, and a multi-bit register 204. Adder 201 has three input terminals: a single-bit input terminal 201A and two multi-bit input terminals 201B 201C. The value at the input terminal in1 of the accumulator is applied to one of the two multi-bit inputs of adder 201 with the other multibit input is fed from the output of multi-bit register 204. Terminal in2 of the accumulator is connected to the single-bit input terminal 210A of adder 201. Implementing adder 201 is a straightforward matter for one skilled in the art.

Quantizer 202 takes the output of adder 201 as its input and produces a single-bit output 205 and a multi-bit output 206. The quantizer 202 will be further discussed later in this document. Delay 203 can be implemented with a D-type flip-flop (DFF) while multibit register 204 can be implemented by a stack of DFF's. Output 205 will be a "1" when the sum of the all three inputs 201A, 201B, 201C are equal to or greater than a predetermined value or threshold. In this case, output 206 will be generated by subtracting the threshold from the sum of the 3 inputs 201A, 201B, 201C. Otherwise, output 206 is equal to the sum. The predetermined value or threshold is termed the modules of the accumulator. The way in which the data is transferred within the accumulator is as follows: On a rising clock edge, the contents of register 204 are clocked out and added to the values already present at input terminals in1 201B and in2 201A. The new sum is instantly made available to quantizer 202 which produces outputs 205 and 206 after some gate delays. Output 206 is then stored at register 204 and waits to be clocked out on the next rising clock edge. Thus, output 206 appears at the output terminal R a clock cycle after the process began. Similarly, output 205 is also delayed by one clock cycle before it is available at the other output terminal C. The single bit delay 203 thereby synchronizes the carry output 205 with the residue output 206.

Referring to FIG. 2, for a modulo-3 accumulator where the threshold of the quantizer is 3, the output of adder 201 will not be greater than 5. This is because when a modulo-3 accumulator is used as one of the first series 151 accumulators in FIG. 1, the two multi-bit inputs 201B, 201C of adder 201 will both be equal to or less than 2. Since the other input to adder 201 will be either a "1" or a "0", the maximum output will be 5. Therefore, the input to the quantizer 202 with a threshold or modules of 3 can be only one of the six combinations as follows: 000, 001, 010, 011, 100, and 101. For inputs 011, 100 and 101, the quantizer 202 outputs a "one" and, in all other cases, the quantizer outputs zero. Having identified the outputs for all possible cases, such a quantizer can be implemented using combinational logic by a person knowledgeable in basic digital logic design.

Figure 3:
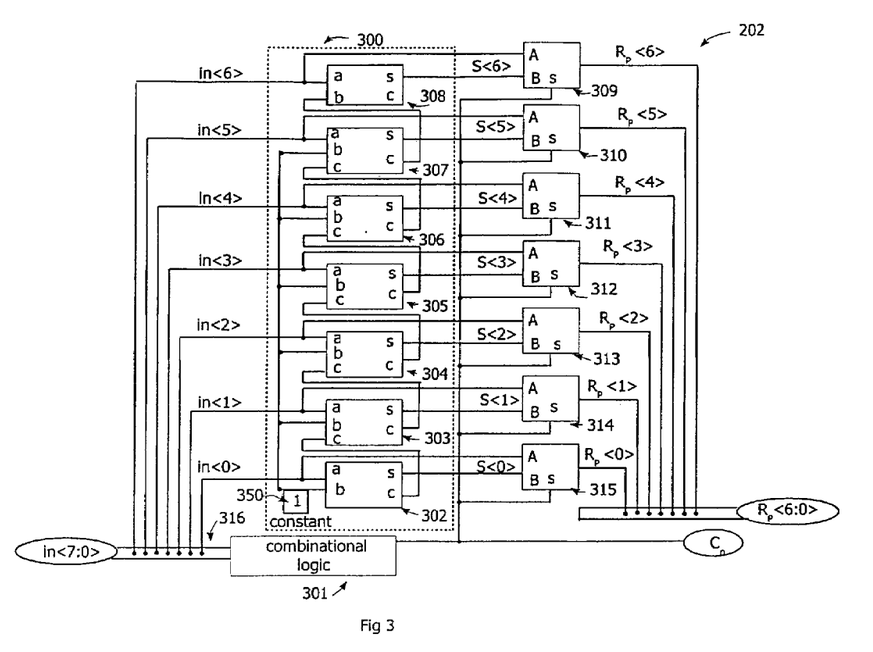
FIG. 3 is a block diagram of a quantizer suitable for use with the modulator of FIG. 1.

FIG. 3 illustrates a circuit arrangement of a quantizer used in a modulus-65 accumulator. Such a quantizer can be used in an accumulator to be used as one of the sedon series 150 of accumulators in FIG. 1. Referring back to FIG. 2, the maximum values of the two multi-bit inputs 201B, 201C of adder 201 will both be 64. As a result, the maximum output of adder 201 will be equal to or less than 129. The value 129 results from the case where both multi-fit inputs 201B, 201C each are 64 and the single bit input 201A has a value of 1. The sum of all these input for this case is 129. This means that the input to quantizer 202 will be 8 bits in width. The modules 65 quantizer 202 illustrated in FIG. 3 comprises an adder 300, MUX' 309 through 315, and combinational logic 301. Adder 300 consists of 7 single-bit adders with the single bit adders 302, 308 receiving the LSB and the MSB of the inputs being half-adders and all others full adders. Logic 301 outputs a one when the decimal value of the 8-bit input is equal to or greater than 65. Otherwise, its output stays a zero. The output of logic 301 goes to the single-bit output terminal Cp. The output of logic 301 is also used internally to select the inputs to the MUX' 309-315. When it is low, the MUX' 309-315 select the 7 LSB's of the 8-bit input 316. The MSB should not be thought of as being lost as logic 301 is designed in such a way that when the output of logic 301 is low the MSB will be low. When the output is high, the MUX' 309-315 will select the other inputs whose decimal value is expected to be equal to the value in input 316 minus 65. The subtracting operation is explained in details in the following paragraph.

Figure 3A:
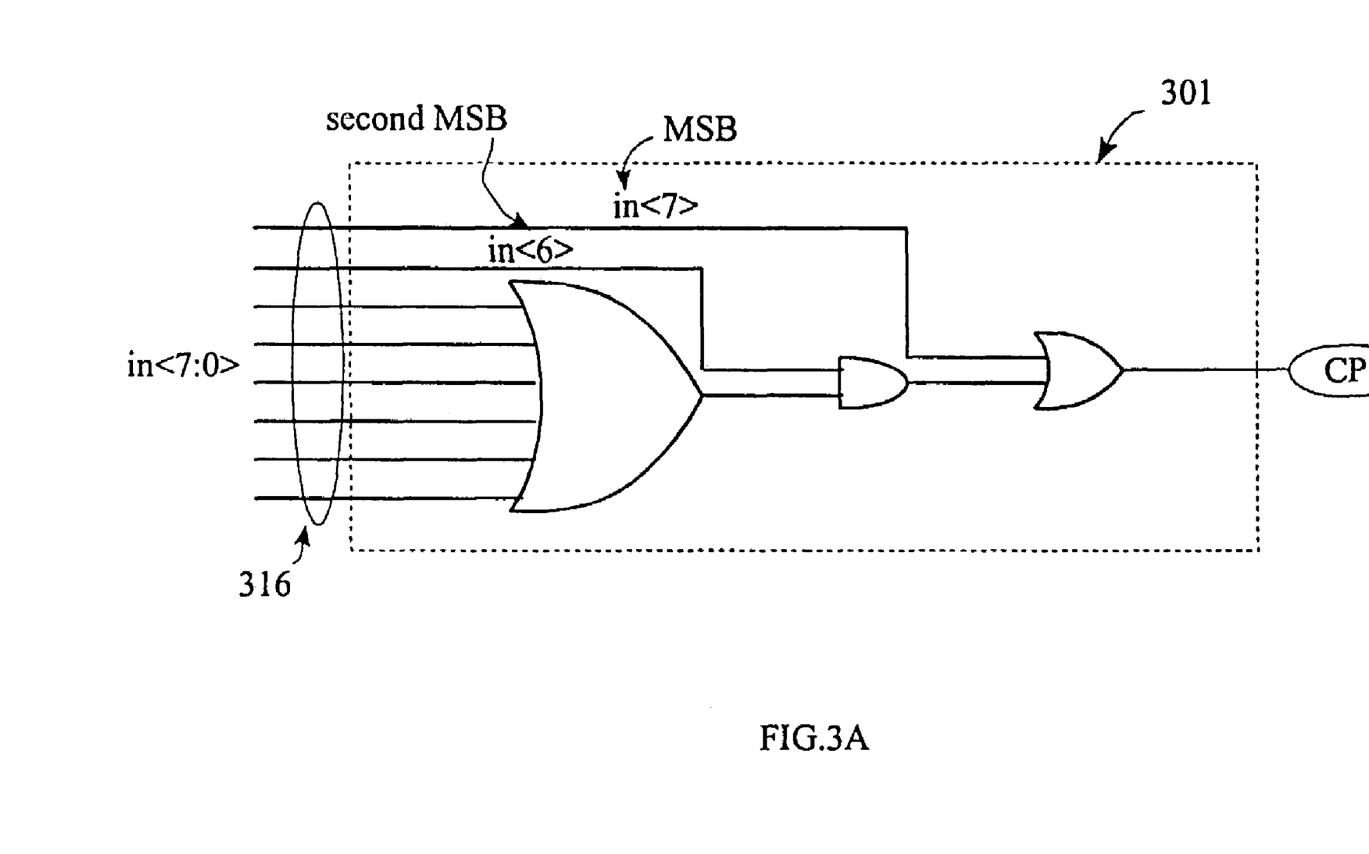
FIG. 3A is a block diagram of a logic circuit which may be used in a quantizer of FIG. 3.

Since the decimal value of input 316 is between 0 and 129, there are only two possible inputs whose MSB is a "1": <1, 0, 0, 0, 0, 0, 0, 1> and <1, 0, 0, 0, 0, 0, 0, 0>. Their decimal values are 129 and 128, respectively. When the MSB is low, the input can still be equal to or greater than 65. This occurs when the second MSB of input 316 is one and at least one of the other 6 LSB's is one. To facilitate ease of reading, the first two cases where the MSB of input 316 is high will be referred to as Case I and Case II, and the last case as Case III. As shown in FIG. 3, a binary word <1, 1, 1, 1, 1, 1> is added to the 6 LSB's by having a constant 350. In Case II, the adding operation will subtract 1 from the six LSB's. In the meantime adder 307 will generate a carry which will force the S output of half adder 308 to be a "0", therefore further subtracting a number of 64 from the input. For Case I and Case II, the MSB will be thrown away. This means that a number of 128 is subtracted from the input. We therefore need to add 63 to the 7 LSBs. This can be achieved by the adding operation as well since the decimal value of the word is 63. In addition, the above analysis shows logic 301 can be implemented by ORing the 6 LSB's of input 316 and then ANDing the result with the second MSB of input 316 and finally ORing the new output with the MSB. FIG. 3A illustrates a block diagram of this logic.

It is should be pointed out that, for accumulators with a content limit or threshold that is a power of 2 (or $2^n$), a separate quantizer is unnecessary. This is due to the fact that an straight adder such as adder 201 in FIG. 2 would usually produce a carry output when the limit is reached. In this case, delay 203 is fed from the carry output and multi-bit register 204 takes the rest of the bits of the adder content as its input. Such an accumulator can be referred to as a straight accumulator. A straight accumulator with a threshold of 32 may be used to implement pulse generator 109 in FIG. 1.

The final block of the delta sigma modulator is the recombiner 110 as indicated in FIG. 1. The primary function of this block is to suppress low-frequency contents in the quantization errors introduced by the two last stage accumulators in each of series 151, 150 of accumulators to cancel out the errors generated by all other accumulators. These last two accumulators 104, 108 are the last accumulators in their respective series 150, 151 of accumulators. These two goals can be achieved by forcing inputs C1, C2, C3, and C4 of the recombiner 110 to go through the following respective transfer functions, $$f_{c1}=Z^{-3}$$

$$f_{c2}=Z^{-2}(1-Z^{-1})$$

$$f_{c3}=Z^{-1}(1-Z^{-1})^2$$

$$f_{c4}=(1-Z^{-1})^3$$

and then summing $C1f_{c1}$, $C2f_{c2}$, $C3f_{c3}$ and $C4f_{c4}$ together.

It is meaningful to place notches around the peak of the quantization noise spectrum. This has been found to reduce the amount of dithering on the divider output edges. A filter function of $(1+Z^{-1}+Z^{-2})$ is chosen because it also provide a dc gain of 3 which compensates for the attenuation occurring in the modulus-3 accumulators. Thus, the expression for the DSM output is given by, $$Y=(C1f_{c1}+C2f_{c2}+C3f_{c3}+C4f_{c4})(1+Z^{-1}+Z^{-2})$$

If we let $C1d3=C1Z^{-3}$, $C2d2=C2Z^{-2}$, and $C3d1=C3Z^{-1}$ the above expression can be expanded as, $$Y=(C1d3(1+Z^{-1}+Z^{-2})+(C2d2(1-Z^{-1})+C3d1(1-Z^{-1})^2+C4(1-Z^{-1})^3)(1-Z^{-1}+Z^{-2})$$

Factoring out the term $(1-Z^{-1})$ in the second term of the above expression, we have, $$Y=(C1d3(1+Z^{-1}+Z^{-2})+(C2d2+C3d1(1-Z^{-1})+C4(1-Z^{-1})^2)(1-Z^{-3})$$

Further factoring out the term $(1-Z^{-1})$, we reach the final express that results in a hardware efficient implementation for this example implementation:

$$Y=(C1d3(1+Z^{-1}+Z^{-2})+(C2d2+(C3d1+C4(1-Z^{-1}))(1-Z^{-1}))(1-Z^{-3})$$

Figure 4:
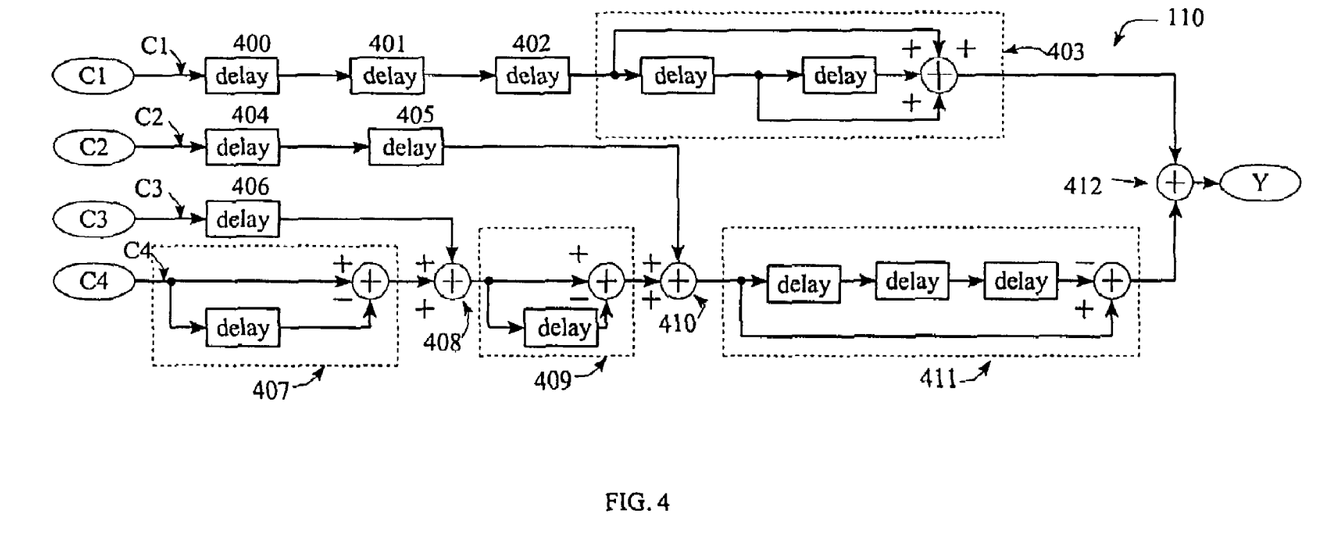
FIG. 4 is block diagram of a recombiner for use with the modulator of FIG. 1.

FIG. 4 illustrates the circuit implementation based on the above expression. C1d3 is realized by forcing input C1 to pass through three delays 400, 401 and 402. Similarly, C2d2 and C3d1 are generated with delays 404, 405 and delay 406, respectively. The term $(1+Z^{-1}+Z^{-2})$ is implemented by block 403 which consists of two delays and an adder. The two $(1-Z^{-1})$ terms in the expression are realized by blocks 407 and 409. Finally, the term $(1-Z^{-3})$ is implemented with block 411. Adders 412, 410, and 408 implement the plus sign immediately preceding C2d2, the plus sign immediately following C2d2, and the plus sign following C3d1 in the expressions, respectively.

A person understanding this invention may now conceive of alternative structures and embodiments or variations of the above all of which are intended to fall within the scope of the invention as defined in the claims that follow.

I claim:

1. A delta sigma modulator for use with a delta sigma frequency synthesizer, the modulator comprising:
    a first group of accumulators;
    a second group of accumulators;
    a recombiner producing an output of said modulator; and
    a bit stream generator,
wherein
    each group of accumulators comprises a plurality of accumulators coupled to one another;
    said second group of accumulators receives an input representing a fractional portion of divider division ratio used by said delta sigma frequency synthesizer;
    said first group of accumulators receives input from said second group of accumulators;
    at least one accumulator in said second group of accumulators receives an input from said bit stream generator;
    said recombiner receives input from said first group of accumulators; and
    both of said first and second groups of accumulators are synchronously clocked.

2. A modulator according to claim 1 wherein each accumulator in said first group of accumulators has a modulus selected from a group which excludes values $2^n$ where n is a natural number.

3. A modulator according to claim 1 wherein each accumulator in said second group of accumulators has a modulus selected from a group which excludes values $2^n$ where n is natural number.

4. A modulator according to claim 2 wherein each accumulator in said first group of accumulators has a modulus of 3.

5. A modulator according to claim 3 wherein each accumulator in said second group of accumulators has modulus equal to a ratio between a frequency available to said delta sigma frequency synthesizer and a frequency resolution desired from said synthesizer.

6. A modulator according to claim 5 wherein each accumulator in said second group of accumulators has a modulus of 65.

7. A modulator according to claim 1 wherein each accumulator in said first and second groups of accumulators comprises:
    an adder receiving inputs to the accumulator;
    a quantized receiving an output of said adder;
    a multiple bit register receiving as result output of said quantized; and
    a delay element receiving a carry output of said quantized, and wherein
    an output of said delay element is a carry output of said accumulator;
    an output of said register is a result of said accumulator; and
    said output of said register is also received by said adder.

8. A modulator according to claim 7 wherein said quantizer for each accumulator for said first group outputs a 1 when an output of said adder is greater than 2.

9. A modulator according to claim 7 wherein said quantized for each accumulator for said second group outputs a 1 when an output of said adder is greater than 65.

10. A modulator according to claim 1 wherein said bit stream generator is an accumulator having a constant as an input value.

11. A delta sigma modulator for use in a delta sigma frequency synthesizer, the delta sigma modulator comprising:
    a first group of cascaded accumulators, said first group of accumulators including at least one accumulator having a modulus selected from a group of values which excludes $2^n$, n being a natural number, at least one of said first group of accumulators receiving an input from another of said first group of accumulators;
    a second group of cascaded accumulators, at least one of said second group of accumulators receiving an input from another of said second group of accumulators;
    a recombiner producing an output of said modulator; and
    a bit stream generator,
wherein
    at least one of said first group of accumulators receives an input from one of said second group of accumulators;
    each one of said second group of accumulators has a modulus equal to a ratio between a frequency input to said synthesizer and a desired frequency resolution;
    each one of said accumulators in said first group produces an output received by said recombiner; and
    at least one of said accumulators in said second group of accumulators receives an output of said generator.

12. A modulator according to claim 11 wherein each accumulator in said second group of accumulators has a modulus selected from a group which excludes values $2^n$ where n is natural number.

13. A modulator according to claim 11 wherein each accumulator in said first and second groups of accumulators comprises:
    an adder receiving inputs to the accumulator;
    a quantized receiving an output of said adder;
    a multiple bit register receiving as result output of said quantized; and
    a delay element receiving a carry output of said quantized, and wherein
    an output of said delay element is a carry output of said accumulator;
    an output of said register is a result of said accumulator; and
    said output of said register is also received by said adder.

14. A modulator according to claim 11 wherein said recombiner includes a filter having a DC gain equal to a multiple of the modulus of said at least one accumulator in said first group of accumulators.

15. A modulator according to claim 11 wherein said output of said generator acts as a dithering signal for at least one of said accumulators in said second group of accumulators.

16. A modulator according to claim 11 wherein said recombiner implements a filter having a transfer function of:

$$Y=(C1d3(1+Z^{-1}+Z^{-2})+(C2d2+(C3d1+C4(1-Z^{-1}))(1-Z^{-1}))(1-Z^{-3})$$

where
Y is an output of said modulator;
C1, C2, C3, C4 are inputs to said recombiner and are each received from accumulators from said first group and
$C1d3=C1Z^{-3}$
$C2d2=C2X^{-2}$
$C3d1=C3Z^{-1}$.

17. A modulator according to claim 1 wherein said recombiner implements a filter having a transfer function of:

$$Y=(C1d3(1+Z^{-1}+Z^{-2})+(C2d2+(C3d1+C4(1Z^{-1}))(1-Z^{-1}))(1-Z^{-3})$$

where
Y is an output of said modulator;
C1, C2, C3, C4 are inputs to said recombiner and are each received from accumulators from said first group and
$C1d3=C1Z^{-3}$
$C2d2=C2X^{-2}$
$C3d1=C3Z^{-1}$.

* * * * *